United States Patent
Takahashi et al.

(10) Patent No.: US 10,178,766 B2
(45) Date of Patent: Jan. 8, 2019

(54) STRETCHABLE CABLE AND STRETCHABLE CIRCUIT BOARD

(71) Applicant: TATSUTA ELECTRIC WIRE & CABLE CO., LTD., Osaka (JP)

(72) Inventors: Akio Takahashi, Kyoto (JP); Tsunehiko Terada, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 15/558,445

(22) PCT Filed: Mar. 14, 2016

(86) PCT No.: PCT/JP2016/058033
§ 371 (c)(1),
(2) Date: Sep. 14, 2017

(87) PCT Pub. No.: WO2016/148113
PCT Pub. Date: Sep. 22, 2016

(65) Prior Publication Data
US 2018/0070446 A1    Mar. 8, 2018

(30) Foreign Application Priority Data

Mar. 18, 2015 (JP) .................. 2015-055141

(51) Int. Cl.
*H05K 1/02* (2006.01)
*B32B 27/18* (2006.01)
(Continued)

(52) U.S. Cl.
CPC ........... *H05K 1/0283* (2013.01); *B32B 27/18* (2013.01); *H01B 1/22* (2013.01); *H01B 7/0009* (2013.01);
(Continued)

(58) Field of Classification Search
CPC ...... H05K 1/148; H05K 1/028; H05K 1/0283; H05K 1/0277; H05K 1/0278; H05K 1/09;
(Continued)

(56) References Cited

U.S. PATENT DOCUMENTS 6,506,978 B1 * 1/2003 Furihata .............. G02F 1/13452
174/254
9,723,713 B1 * 8/2017 Vrtis .................... H05K 1/0281
(Continued)

FOREIGN PATENT DOCUMENTS

EP    2450911 A1    5/2012
EP    3196257 A1    7/2017
(Continued)

OTHER PUBLICATIONS

International Search Report dated May 24, 2016 filed in PCT/JP2016/058033.
(Continued)

*Primary Examiner* — Steven T Sawyer
(74) *Attorney, Agent, or Firm* — Rankin, Hill & Clark LLP (57) ABSTRACT

A stretchable cable 1 includes a sheet-shaped stretchable base material 2 exhibiting elasticity and elongated in one direction, and a stretchable wiring 3 formed on one surface of the stretchable substrate 2 and exhibiting elasticity. The stretchable base material 2 is made of a material exhibiting elasticity. The stretchable wiring 3 is made of a conductive composition including elastomer and a conductive filler filling the elastomer.

13 Claims, 5 Drawing Sheets

(51) Int. Cl.

| | | |
|---|---|---|
| *H01B 7/06* | (2006.01) | |
| *H01B 7/08* | (2006.01) | |
| *H05K 1/09* | (2006.01) | |
| *H05K 3/46* | (2006.01) | |
| *H01B 1/22* | (2006.01) | |
| *H01B 7/00* | (2006.01) | |
| *H01B 7/04* | (2006.01) | |
| *H05K 1/11* | (2006.01) | |
| *H05K 1/18* | (2006.01) | |
| *H05K 3/12* | (2006.01) | |
| *H05K 3/20* | (2006.01) | |
| *H05K 3/30* | (2006.01) | |
| *H05K 3/40* | (2006.01) | |

(52) U.S. Cl.
CPC ............ *H01B 7/04* (2013.01); *H01B 7/06* (2013.01); *H01B 7/08* (2013.01); *H05K 1/09* (2013.01); *H05K 1/095* (2013.01); *H05K 1/115* (2013.01); *H05K 1/181* (2013.01); *H05K 3/1283* (2013.01); *H05K 3/207* (2013.01); *H05K 3/303* (2013.01); *H05K 3/4053* (2013.01); *H05K 3/46* (2013.01); *H05K 3/4664* (2013.01)

(58) Field of Classification Search
CPC ........ H05K 1/095; H05K 1/115; H05K 1/181; H05K 3/1283; H05K 3/207; H05K 3/303; H05K 3/4053; H05K 3/46; H05K 3/4664; B32B 27/18; H01B 1/22; H01B 7/0009; H01B 7/04; H01B 7/06; H01B 7/08
See application file for complete search history.

(56) References Cited

U.S. PATENT DOCUMENTS

| | | | |
|---|---|---|---|
| 2006/0057340 A1 | 3/2006 | Umeda | |
| 2009/0283891 A1 | 11/2009 | Michielsen | |
| 2010/0051333 A1* | 3/2010 | Oki .................... | C09D 11/101 174/257 |
| 2010/0238636 A1* | 9/2010 | Mascaro ........... | B29C 45/14639 361/750 |
| 2012/0026700 A1* | 2/2012 | Furuta .................... | H05K 3/361 361/750 |
| 2012/0119626 A1 | 5/2012 | Takahashi | |
| 2016/0211473 A1* | 7/2016 | Van Den Ende .... | H05K 1/0283 |
| 2016/0270223 A1* | 9/2016 | Cherenack .......... | H05K 1/0283 |
| 2017/0034907 A1* | 2/2017 | Iwase .................. | H05K 1/0283 |
| 2017/0194073 A1 | 7/2017 | Takahashi | |
| 2018/0020936 A1 | 1/2018 | Kwon | |

FOREIGN PATENT DOCUMENTS

| | | |
|---|---|---|
| EP | 3245948 A1 | 11/2017 |
| JP | 59094487 A2 | 5/1984 |
| JP | 2005217030 A2 | 8/2005 |
| JP | 2006260783 A2 | 9/2006 |
| JP | 4191678 | 12/2008 |
| JP | 2009533839 T2 | 9/2009 |
| JP | 4437946 B2 | 3/2010 |
| JP | 4468750 B2 | 5/2010 |
| JP | 2012033674 A2 | 2/2012 |
| JP | 4949802 B2 | 6/2012 |
| JP | 2013057296 A2 | 3/2013 |

OTHER PUBLICATIONS

Sigurd Wagner et al., "Materials for stretchable electronics", MRS Bulletin, vol. 37, No. 3, Mar. 1, 2012, pp. 207-213.

Li Zhuo et al., "Shape Engineering of the Fillers in Stretchable, electrically conductive adhesives: Its effect on percolation and conductivity change during stretching", 34th Electronic Components Conference, IEEE, May 28, 2013, pp. 2196-2200.

Lau K T et al., "Coiled carbon nanotubes: Synthesis and their potential applications in advanced composite structures", Proceeding of GT2005, ASME Turbo Expo 2005: Power for Land, Sea and Airring, Elsevier, Amsterdam, NL, vol. 37, No. 6, Apr. 3, 2006, pp. 437-448.

Extended European Search Report (EESR) dated Oct. 15, 2018 for the corresponding European Patent Application No. 16764943.3.

\* cited by examiner

STRETCHABLE CABLE AND STRETCHABLE CIRCUIT BOARD

TECHNICAL FIELD

The present invention relates to a stretchable cable exhibiting elasticity and a stretchable circuit board exhibiting elasticity.

BACKGROUND ART

A flexible printed circuit (FPC) board exhibits bendability, whereas does not exhibit elasticity. Thus, a circuit board has been known, which is configured such that a rigid substrate is stacked on a FPC etched in a wave shape (an accordion shape). However, in this circuit board, the FPC can deform by twisting, but the FPC itself is not stretchable.

CITATION LIST

Patent Literature

Patent Literature 1: JP-T-2009-533839

SUMMARY OF INVENTION

Problems to be Solved by the Invention

The present invention is intended to provide a stretchable cable exhibiting elasticity.

The present invention is intended to provide a stretchable circuit board exhibiting elasticity.

Solutions to the Problems

A stretchable cable according to the present invention includes a sheet-shaped base material exhibiting elasticity, and a wiring formed on one surface of the base material and exhibiting elasticity. The wiring is made of a conductive composition containing elastomer and a conductive filler filling the elastomer.

In this configuration, the base material and the wiring exhibit elasticity. Thus, the stretchable cable exhibiting elasticity is obtained.

In one embodiment of the present invention, the conductive filler includes a coil-shaped conductive filler.

The coil-shaped conductive filler may be, for example, a small metal coil manufactured in such a manner that metal plating is applied to a natural helical structure. The coil-shaped conductive filler may be a small metal spring manufactured in such a manner that a metal wire is processed into a coil shape. The coil-shaped conductive filler may be a carbon nanocoil.

In this configuration, the conductive filler includes the coil-shaped conductive filler. Thus, when the elastomer in the conductive composition stretches, the conductive filler in the conductive composition stretches as in a pulled coil. Accordingly, even when the elastomer stretches, an increase in a resistance value of the wiring can be suppressed. As a result, the stretchable cable can be realized, which has the wiring exhibiting elasticity and configured so that an increase in the resistance value in stretching can be suppressed.

In one embodiment of the present invention, the conductive filler includes a dendrite-shaped conductive filler.

The dendrite shape indicates such a shape that a rod-shaped bifurcated branch extends from a rod-shaped main branch in a two-dimensional direction or a three-dimensional direction. Moreover, the dendrite shape also includes a shape in which the bifurcated branch bends in the middle, and a shape in which a rod-shaped bifurcated branch further extends from the middle of the bifurcated branch.

In this configuration, the conductive filler includes the dendrite-shaped conductive filler. Even when the elastomer in the conductive composition is stretched, the probability of contacting the conductive fillers of the conductive composition each other can be improved. Thus, even in the case of stretching the elastomer, a conductive path can be satisfactorily formed in the elastomer. As a result, the stretchable cable can be realized, which has the wiring exhibiting elasticity and configured so that an increase in the resistance value in stretching can be suppressed.

A first stretchable circuit board according to the present invention includes a stretchable substrate exhibiting elasticity, a non-stretchable substrate bonded to a partial region of one surface of the stretchable substrate and not exhibiting elasticity, and a stretchable wiring formed on the other surface of the stretchable substrate and exhibiting elasticity.

In this configuration, the non-stretchable substrate not exhibiting elasticity is bonded to the partial region of one surface of the stretchable substrate exhibiting elasticity. An electronic component not exhibiting elasticity can be mounted on this non-stretchable substrate side. The stretchable wiring exhibiting elasticity is formed on the other surface of the stretchable substrate. The stretchable substrate and the stretchable wiring hold elasticity in a region to which the non-stretchable substrate is not bonded. Thus, the stretchable circuit board exhibiting elasticity is obtained.

In one embodiment of the present invention, a conductor layer formed on the surface of the non-stretchable substrate opposite to the surface bonded to the stretchable substrate and a first via penetrating the stretchable substrate and the non-stretchable substrate and connecting the stretchable wiring and the conductor layer together are provided. In this configuration, the electronic component mounted on the non-stretchable substrate side can be connected to the stretchable wiring through the conductor layer and the first via.

In one embodiment of the present invention, an insulating layer covering the conductor layer, an electronic component provided on a surface of the insulating layer, and a second via penetrating the insulating layer and electrically connecting the conductor layer and the electronic component together are provided. In this configuration, the electronic component can be connected to the stretchable wiring through the second via, the conductor layer, and the first via.

A second stretchable circuit board according to the present invention includes a stretchable substrate exhibiting elasticity, a stretchable wiring formed on a portion of one surface of the stretchable substrate and exhibiting elasticity, and a non-stretchable substrate not exhibiting elasticity and bonded to a partial region of one surface of the stretchable substrate, the partial region including at least a portion of the stretchable wiring.

In this configuration, the stretchable wiring exhibiting elasticity is formed in the partial region of one surface of the stretchable substrate exhibiting elasticity. The non-stretchable substrate not exhibiting elasticity is bonded to the partial region of one surface of the stretchable substrate, the partial region including at least a portion of the stretchable wiring. An electronic component not exhibiting elasticity can be mounted on this non-stretchable substrate side. The stretchable substrate and the stretchable wiring hold elasticity in a region to which the non-stretchable substrate is not bonded. Thus, the stretchable circuit board exhibiting elasticity is obtained.

In one embodiment of the present invention, a conductor layer formed on the surface of the non-stretchable substrate opposite to the surface bonded to the stretchable substrate and a first via penetrating the non-stretchable substrate and connecting the stretchable wiring and the conductor layer together are further provided. In this configuration, the electronic component mounted on the non-stretchable substrate side can be connected to the stretchable wiring through the conductor layer and the first via.

In one embodiment of the present invention, an insulating layer covering the conductor layer, an electronic component provided on a surface of the insulating layer, and a second via penetrating the insulating layer and electrically connecting the conductor layer and the electronic component together are further provided. In this configuration, the electronic component can be connected to the stretchable wiring through the second via, the conductor layer, and the first via.

In one embodiment of the present invention, the non-stretchable substrate is a rigid substrate or a flexible substrate.

DESCRIPTION OF EMBODIMENTS

Embodiments of the present invention will be described below in detail with reference to the attached drawings.

Figure 1:
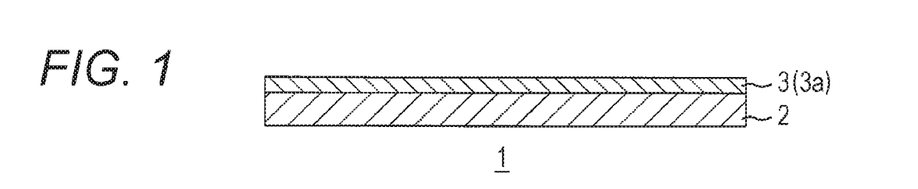
FIG. 1 is a schematic cross-sectional view of a configuration of a stretchable cable of a first embodiment of the present invention.

FIG. 1 is a schematic cross-sectional view of a configuration of a stretchable cable of a first embodiment of the present invention.

A stretchable cable 1 includes a sheet-shaped stretchable base material 2 exhibiting elasticity and elongated in one direction (a right-to-left direction in FIG. 1), and a stretchable wiring 3 formed on one surface of the stretchable base material 2 and exhibiting elasticity. The stretchable wiring 3 includes a plurality of stretchable wires 3a. The stretchable wires 3a extend in parallel to each other at intervals in a width direction of the stretchable base material 2.

The stretchable base material 2 is made of a material exhibiting elasticity. For example, elastomer (e.g., polyurethane elastomer, styrene elastomer, olefin elastomer, polyamide elastomer, and silicone elastomer) or synthetic rubber (e.g., ethylene-propylene rubber, nitrile-butadiene rubber, silicone rubber, acrylic rubber, fluorine rubber, and urethane rubber) can be used as the material forming the stretchable base material 2.

The stretchable wiring 3 is made of a conductive composition including elastomer and a conductive filler filling the elastomer. The shape of the conductive filler may be a coil shape, a dendrite shape, a block shape, a spherical shape, a flake shape, a needle shape, and a fiber shape.

In this embodiment, the conductive filler includes a conductive filler in the coil shape (hereinafter referred to as a "coil-shaped conductive filler"). The coil shape includes a helical shape and a spiral shape. In this embodiment, the conductive filler is in the coil shape. Thus, when the elastomer stretches, the coil-shaped conductive filler stretches as in a pulled coil. Thus, even when the elastomer stretches, an increase in a resistance value of the stretchable wiring 3 can be suppressed. Thus, the stretchable cable 1 can be realized, which has the stretchable wiring 3 exhibiting elasticity and configured so that an increase in the resistance value in stretching can be suppressed.

The elastomer is resin having elastic force, such as styrene elastomer, olefin elastomer, polyester elastomer, polyurethane elastomer, polyamide elastomer, and silicone elastomer. The polyurethane elastomer includes a hard segment and a soft segment. The soft segment includes, for example, carbonate, ester, and ether. Specifically, NE-8880, MAU-9022, NE-310, NE-302HV, and CU-8448 etc. manufactured by Dainichiseika Color and Chemicals Mfg. Co., Ltd. can be used. The elastomer may be made of a single type of resin or multiple types of resin. Considering improvement of manufacturability (workability), flexibility, etc., the elastomer may contain an additive such as a plasticizing agent, a processing aid, a cross-linking agent, a vulcanization accelerator, a vulcanization aid, an anti-aging agent, a softening agent, and a coloring agent.

The filling rate of the coil-shaped conductive filler in the conductive composition is preferably equal to or greater than 30% by weight and equal to or less than 95% by weight.

The coil-shaped conductive filler may be a small metal coil manufactured in such a manner that metal plating is applied to a natural helical structure. Such a small metal coil is manufactured in such a manner that metal plating is applied to a small helical structure in plants and algae. For example, the small metal coil is obtained in such a manner that metal plating is applied to alga spirulina. The alga spirulina has a coil shape. After the spirulina has been cultivated and immobilized, metal plating (non-electrolytic plating) is applied to the spirulina. Metal exhibiting conductivity, such as copper, silver, and gold is used as a metal plating material.

Moreover, the coil-shaped conductive filler may be a small metal spring manufactured in such a manner that a metal wire is processed into a coil shape. Specifically, a wire rod having a conductor diameter (a wire diameter) of equal to or smaller than 30 μm is processed into a coil shape, and in this manner, a small metal spring is obtained. An extremely-thin wire made of metal exhibiting conductivity, such as copper or silver or the above-described extremely-thin metal-plated wire is used as the wire rod.

Further, the coil-shaped conductive filler may be a carbon nanocoil (CNC). The carbon nanocoil indicates a carbon nanofiber (CNF) grown in a helical shape. The carbon nanofiber is a fibrous material made of carbon.

The conductor diameter (the wire diameter) of the coil-shaped conductive filler is preferably equal to or greater than 5 μm and equal to or smaller than 30 μm. The coil outer diameter of the coil-shaped conductive filler is preferably equal to or smaller than 150 μm. The pitch of the coil-shaped conductive filler is preferably equal to or greater than 10 μm and equal to or smaller than 150 μm. The coil length of the coil-shaped conductive filler is preferably equal to or smaller than 1 mm, and more preferably equal to or smaller than 500 μm.

Note that in addition to the above-described coil-shaped conductive filler, a block-shaped, spherical-shaped, flake-shaped, needle-shaped, or fiber-shaped conductive filler may be used as the conductive filler, for example.

Instead of or in addition to the coil-shaped conductive filler, the conductive filler may include a dendrite-shaped conductive filler. In the case of containing the dendrite-shaped conductive filler in the conductive filler, even when the elastomer is stretched, the probability of contacting the conductive fillers each other can be improved. Thus, even in the case of stretching the elastomer, a conductive path can be satisfactorily formed in the elastomer. As a result, the stretchable cable can be realized, which has the stretchable wiring 3 exhibiting elasticity and configured so that an increase in the resistance value in stretching can be suppressed.

The dendrite shape indicates such a shape that a rod-shaped bifurcated branch extends from a rod-shaped main branch in a two-dimensional direction or a three-dimensional direction. Moreover, the dendrite shape also includes a shape in which the bifurcated branch bends in the middle, and a shape in which a rod-shaped bifurcated branch further extends from the middle of the bifurcated branch.

The dendrite-shaped conductive filler may be for example, such silver-coated copper powder that dendrite-shaped copper powder is coated with silver. Moreover, the dendrite-shaped conductive filler may be, for example, dendrite-shaped copper powder or silver powder. In a case where the conductive filler is made of the dendrite-shaped silver-coated copper powder, the conductive filler can be realized, which is available at relatively-low cost while having a resistance value close to that of the conductive filler made of silver and which exhibits excellent conductivity and migration resistance. In a case where the conductive filler is made of the dendrite-shaped copper powder, the conductive filler can be realized, which is available at low cost while having a low resistance value. The dendrite-shaped conductive filler may be such gold-coated copper powder that dendrite-shaped copper powder is coated with other conductive materials than silver, such as gold.

The lower limit of the particle size of the dendrite-shaped conductive filler is 1 μm, and preferably 2 μm. When the lower limit is equal to or greater than 1 μm, the conductive fillers can easily contact each other, leading to satisfactory conductivity of the stretchable wiring 3. Moreover, the upper limit of the particle size of the conductive filler is 20 μm, and preferably 10 μm. When the upper limit is equal to or smaller than 20 μm, the thickness of the stretchable wiring 3 can be decreased.

In the stretchable cable 1 of the first embodiment, the stretchable base material 2 and the stretchable wiring 3 exhibit elasticity. Thus, the stretchable cable exhibiting elasticity is obtained.

The stretchable cable 1 illustrated in FIG. 1 is manufactured as follows, for example. That is, the conductive composition (conductive paste) as the material of the stretchable wiring 3 is screen-printed on one surface of the stretchable base material 2. Then, the conductive paste is dried, and in this manner, the stretchable wiring 3 is formed on one surface of the stretchable base material 2.

Note that the stretchable wiring 3 may be formed in such a manner that the conductive composition (the conductive paste) as the material of the stretchable wiring 3 is dried after having been applied to one surface of the stretchable base material 2 by a dispenser.

Alternatively, the stretchable wiring 3 may be formed in such a manner that the stretchable wiring 3 is formed on a not-shown releasing film by, e.g., screen printing and then the stretchable wiring 3 is thermally transferred onto the stretchable base material 2.

Figure 2:
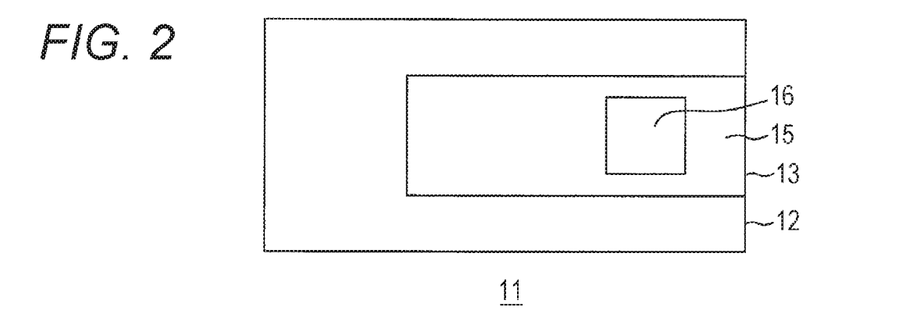
FIG. 2 is a schematic plan view of a stretchable circuit board of a second embodiment of the present invention.
Figure 3:
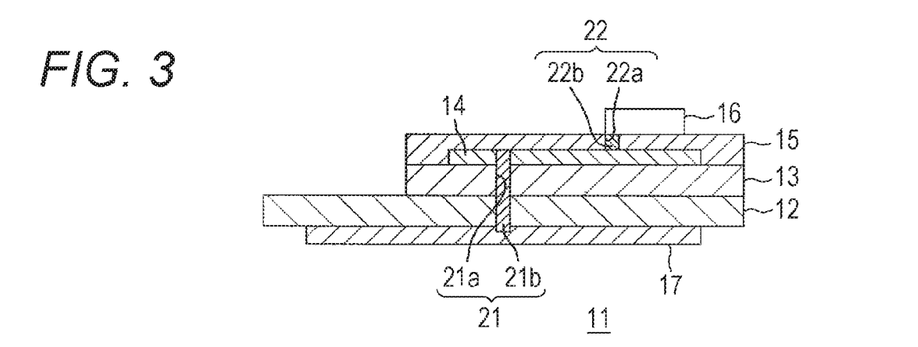
FIG. 3 is a schematic cross-sectional view of the stretchable circuit board of FIG. 2.

FIG. 2 is a schematic plan view of a stretchable circuit board of a second embodiment of the present invention. FIG. 3 is a schematic cross-sectional view of the stretchable circuit board of FIG. 2.

A stretchable circuit board 11 includes a stretchable substrate 12 exhibiting elasticity and formed in a rectangular shape elongated in one direction (a right-to-left direction in FIG. 2) as viewed in the plane. The stretchable substrate 12 is made of a material exhibiting elasticity. For example, elastomer (e.g., polyurethane elastomer, styrene elastomer, olefin elastomer, polyamide elastomer, and silicone elastomer) or synthetic rubber (e.g., ethylene-propylene rubber, nitrile-butadiene rubber, silicone rubber, acrylic rubber, fluorine rubber, and urethane rubber) can be used as the material forming the stretchable substrate 12.

A non-stretchable substrate 13 not exhibiting elasticity and formed in a rectangular shape elongated in one direction (the right-to-left direction in FIG. 2) as viewed in the plane is bonded and fixed to a partial region of one surface (an upper surface in FIG. 3) of the stretchable substrate 12. In this embodiment, the length and width of the non-stretchable substrate 13 are shorter than those of the stretchable substrate 12. Moreover, in this embodiment, the non-stretchable substrate 13 is bonded to the stretchable substrate 12 in such a posture that as viewed in the plane, one end of the non-stretchable substrate 13 is coincident with one end of the stretchable substrate 12 and a center line passing through the center of the non-stretchable substrate 13 in a width direction thereof is coincident with a center line passing through the center of the stretchable substrate 12 in a width direction thereof. A conductor layer 14 is formed on the surface (an upper surface in FIG. 3) of the non-stretchable substrate 13 opposite to the surface bonded to the stretchable substrate 12.

A rigid substrate or a flexible substrate is used as the non-stretchable substrate 13. Specifically, a glass epoxy substrate, a bismaleimide substrate, a copper clad laminate (CCL), etc. are used as the non-stretchable substrate 13. The copper clad laminate (CCL) is configured such that copper foil is bonded to one or both surfaces of an insulating film made of polyimide etc. In the case of using the copper clad laminate (CCL) as the non-stretchable substrate 13, the conductor layer 14 can be formed of the copper foil of the copper clad laminate (CCL).

An insulating layer 15 covering the conductor layer 14 is formed on the upper surface of the non-stretchable substrate 13. For example, polyimide, epoxy, glass epoxy, or bismaleimide is used as the insulating layer 15. An electronic component 16 such as a semiconductor element is mounted on a surface (an upper surface in FIG. 3) of the insulating layer 15. The semiconductor element includes, for example, a transistor, an integrated circuit (IC, LSI), a resistor, and a capacitor.

A stretchable wiring 17 exhibiting elasticity is formed on the other surface (a lower surface in FIG. 3) of the stretchable substrate 12. The stretchable wiring 17 is made of a conductive composition containing elastomer and a conductive filler filling the elastomer. The conductive filler may include a coil-shaped conductive filler as described above. Alternatively, the conductive filler may include a dendrite-shaped conductive filler as described above. As another alternative, the conductive filler may include both of the coil-shaped conductive filler and the dendrite-shaped conductive filler as described above.

The conductor layer 14 and the stretchable wiring 17 are electrically connected together through a first via 21 penetrating the non-stretchable substrate 13 and the stretchable substrate 12. For example, the first via 21 includes a through-hole 21a penetrating the conductor layer 14, the non-stretchable substrate 13, and the stretchable substrate 12; and conductive paste 21b embedded in the through-hole 21a The conductive paste 21b may be, for example, epoxy resin filled with the conductive filler such as silver-coated copper powder, silver, and copper. The conductive paste 21b may be, for example, paste described in Japanese Patent No. 4191678, Japanese Patent No. 4468750, Japanese Patent No. 4437946, and Japanese Patent No. 4949802. The first via 21 may include a through-hole penetrating the conductor layer 14, the non-stretchable substrate 13, and the stretchable substrate 12; and a metal layer (e.g., copper) formed on an inner surface of the through-hole by plating.

The electronic component 16 and the conductor layer 14 are electrically connected together through a second via 22 penetrating the insulating layer 15. The second via 22 includes, for example, a through-hole 22a penetrating the insulating layer 15, and conductive paste 22b embedded in the through-hole 22a. The second via 22 may include a through-hole penetrating the insulating layer 15, and a metal layer (e.g., copper) formed on an inner surface of the through-hole by plating. The electronic component 16 is electrically connected to the stretchable wiring 17 through the second via 22, the conductor layer 14, and the first via 21.

In this stretchable circuit board 11, the non-stretchable substrate 13 not exhibiting elasticity is bonded to a partial region of one surface (the upper surface) of the stretchable substrate 12 exhibiting elasticity. The stretchable wiring 17 exhibiting elasticity is formed on the other surface (the lower surface) of the stretchable substrate 12. The stretchable substrate 12 and the stretchable wiring 17 hold elasticity in a region to which the non-stretchable substrate 13 is not bonded. Thus, the stretchable circuit board exhibiting elasticity is obtained.

Figure 4A:
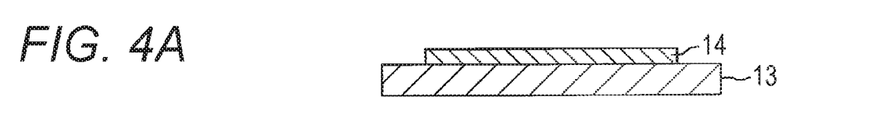
FIGS. 4A to 4D are schematic cross-sectional views for describing the steps of manufacturing the stretchable circuit board of FIG. 2.
Figure 4B:
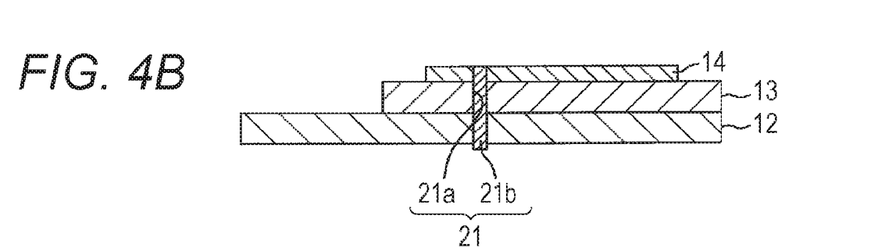

FIGS. 4A to 4D are schematic cross-sectional views for describing the steps of manufacturing the stretchable circuit board 11. First, as illustrated in FIG. 4A, the conductor layer 14 is formed on one surface (the upper surface) of the non-stretchable substrate 13. Next, as illustrated in FIG. 4B, the non-stretchable substrate 13 is bonded to the partial region of one surface (the upper surface) of the stretchable substrate 12. Next, the through-hole 21a penetrating the conductor layer 14, the non-stretchable substrate 13, and the stretchable substrate 12 is formed. Subsequently, the conductive paste 21b is embedded in the through-hole 21a. Thus, the first via 21 is formed.

Figure 4C:
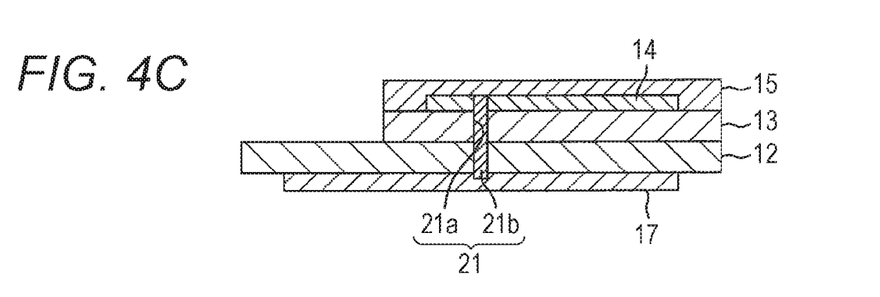

Next, as illustrated in FIG. 4C, the insulating layer 15 covering the conductor layer 14 is formed on one surface (the upper surface) of the non-stretchable substrate 13. Subsequently, the stretchable wiring 17 is formed on the other surface (the lower surface) of the stretchable substrate 12. Specifically, the conductive composition (the conductive paste) as the material of the stretchable wiring 17 is screen-printed on the lower surface of the stretchable substrate 12. Then, the conductive paste is dried, and in this manner, the stretchable wiring 17 is formed on the lower surface of the stretchable substrate 12. Note that the stretchable wiring 17 may be formed in such a manner that the conductive composition (the conductive paste) as the material of the stretchable wiring 17 is dried after having been applied to the lower surface of the stretchable substrate 12 by a dispenser. Alternatively, the stretchable wiring 17 may be formed in such a manner that the stretchable wiring 17 is formed on a not-shown releasing film by, e.g., screen printing and then the stretchable wiring 17 is thermally transferred onto the stretchable substrate 12. The stretchable wiring 17 is in such a state that the stretchable wiring 17 is connected to the conductor layer 14 through the first via 21.

Figure 4D:
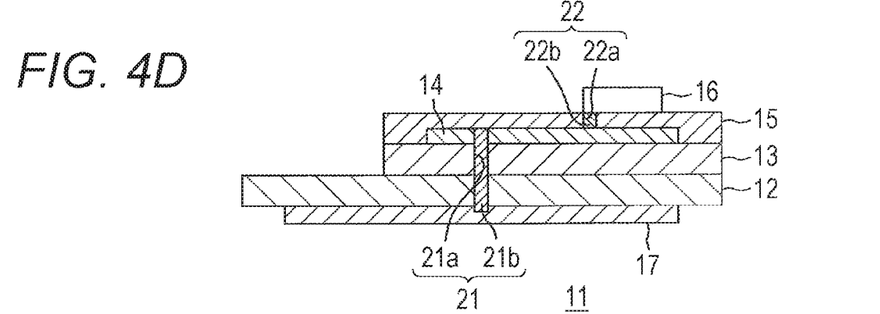

Next, as illustrated in FIG. 4D, the through-hole 22a is formed to penetrate the insulating layer 15 to the conductor layer 14. Subsequently, the conductive paste 22b is embedded in the through-hole 22a. Thus, the second via 22 is formed. Finally, the electronic component 16 is mounted on the insulating layer 15 with the electronic component 16 being electrically connected to the second via 22.

Figure 5:
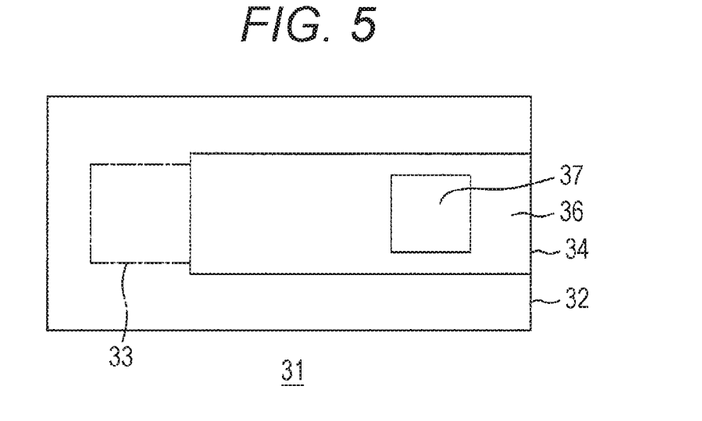
FIG. 5 is a schematic plan view of a stretchable circuit board of a third embodiment of the present invention.
Figure 6:
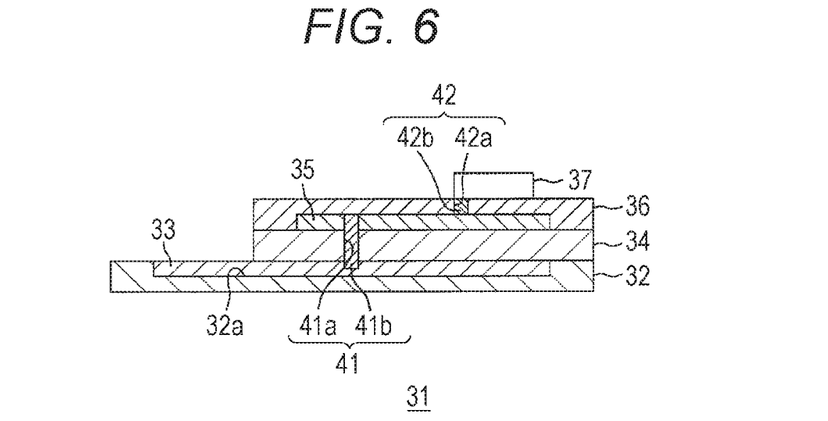
FIG. 6 is a schematic cross-sectional view of the stretchable circuit board of FIG. 5.

FIG. 5 is a schematic plan view of a stretchable circuit board of a third embodiment of the present invention. FIG. 6 is a schematic cross-sectional view of the stretchable circuit board of FIG. 5.

A stretchable circuit board 31 includes a stretchable substrate 32 exhibiting elasticity and formed in a rectangular shape elongated in one direction (a right-to-left direction in FIG. 5) as viewed in the plane. The stretchable substrate 32 is made of a material exhibiting elasticity. For example, elastomer (e.g., polyurethane elastomer, styrene elastomer, olefin elastomer, polyamide elastomer, and silicone elastomer) or synthetic rubber (e.g., ethylene-propylene rubber, nitrile-butadiene rubber, silicone rubber, acrylic rubber, fluorine rubber, and urethane rubber) can be used as the material forming the stretchable substrate 32.

A stretchable wiring 33 exhibiting elasticity is formed on a partial region of one surface (an upper surface in FIG. 6) of the stretchable substrate 32. Specifically, a recessed portion 32a is formed at one surface (the upper surface) of the stretchable substrate 32. The stretchable wiring 33 is formed in the recessed portion 32a. The stretchable wiring 33 is made of a conductive composition containing elastomer and a conductive filler filling the elastomer. The conductive filler may include a coil-shaped conductive filler as described above. Alternatively, the conductive filler may include a dendrite-shaped conductive filler as described above. As another alternative, the conductive filler may include both of the coil-shaped conductive filler and the dendrite-shaped conductive filler as described above.

A non-stretchable substrate 34 not exhibiting elasticity and formed in a rectangular shape elongated in one direction (the right-to-left direction in FIG. 5) as viewed in the plane is bonded and fixed to a partial region of one surface (the upper surface) of the stretchable substrate 32, the partial region including at least a portion of the stretchable wiring 33. In this embodiment, the length and width of the non-stretchable substrate 34 are shorter than those of the stretchable substrate 32. Moreover, in this embodiment, the non-stretchable substrate 34 is bonded to the stretchable substrate 32 in such a posture that as viewed in the plane, one end of the non-stretchable substrate 34 is coincident with one end of the stretchable substrate 32 and a center line passing through the center of the non-stretchable substrate 34 in a width direction thereof is coincident with a center line passing through the center of the stretchable substrate 32 in a width direction thereof. A conductor layer 35 is formed on the surface (an upper surface in FIG. 6) of the non-stretchable substrate 34 opposite to the surface bonded to the stretchable substrate 32.

A rigid substrate or a flexible substrate is used as the non-stretchable substrate 34. Specifically, a glass epoxy substrate, a bismaleimide substrate, a copper clad laminate (CCL), etc. are used as the non-stretchable substrate 34. The copper clad laminate (CCL) is configured such that copper foil is bonded to one or both surfaces of an insulating film made of polyimide etc. In the case of using the copper clad laminate (CCL) as the non-stretchable substrate 34, the conductor layer 35 can be formed of the copper foil of the copper clad laminate (CCL).

An insulating layer 36 covering the conductor layer 35 is formed on the upper surface of the non-stretchable substrate 34. For example, polyimide, epoxy, glass epoxy, or bismaleimide is used as the insulating layer 36. An electronic component 37 such as a semiconductor element is mounted on a surface (an upper surface in FIG. 6) of the insulating layer 36.

The conductor layer 35 and the stretchable wiring 33 are electrically connected together through a first via 41 penetrating the non-stretchable substrate 34. For example, the first via 41 includes a through-hole 41a penetrating the conductor layer 35 and the non-stretchable substrate 34; and conductive paste 41b embedded in the through-hole 41a. The first via 41 may include a through-hole penetrating the conductor layer 35 and the non-stretchable substrate 34; and a metal layer (e.g., copper) formed on an inner surface of the through-hole by plating.

The electronic component 37 and the conductor layer 35 are electrically connected together through a second via 42 penetrating the insulating layer 36. The second via 42 includes, for example, a through-hole 42a penetrating the insulating layer 36, and conductive paste 42b embedded in the through-hole 42a. The second via 42 may include a through-hole penetrating the insulating layer 36, and a metal layer (e.g., copper) formed on an inner surface of the through-hole by plating. The electronic component 37 is electrically connected to the stretchable wiring 33 through the second via 42, the conductor layer 35, and the first via 41.

In this stretchable circuit board 31, the stretchable wiring 33 exhibiting elasticity is formed on the partial region of one surface (the upper surface) of the stretchable substrate 32 exhibiting elasticity. The non-stretchable substrate 34 not exhibiting elasticity is bonded to the partial region of one surface (the upper surface) of the stretchable substrate 32, the partial region including at least a portion of the stretchable wiring 33. The stretchable substrate 32 and the stretchable wiring 33 hold elasticity in a region to which the non-stretchable substrate 34 is not bonded. Thus, the stretchable circuit board 31 exhibiting elasticity is obtained.

Figure 7A:
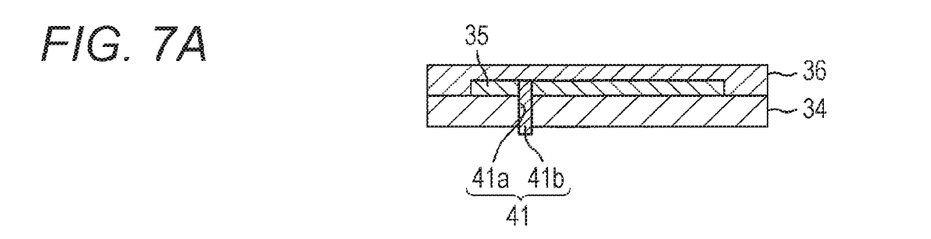
FIGS. 7A to 7D are schematic cross-sectional views for describing the steps of manufacturing the stretchable circuit board of FIG. 5.

FIGS. 7A to 7D are schematic cross-sectional views for describing the steps of manufacturing the stretchable circuit board 31. First, as illustrated in FIG. 7A, the conductor layer 35 is formed on one surface (the upper surface) of the non-stretchable substrate 34. Next, the through-hole 41a penetrating the conductor layer 35 and the non-stretchable substrate 34 is formed. Next, the conductive paste 41b is embedded in the through-hole 41a. Thus, the first via 41 is formed. Subsequently, the insulating layer 36 covering the conductor layer 35 is formed on one surface (the upper surface) of the non-stretchable substrate 34. In this manner, the non-stretchable substrate 34 having the conductor layer 35, the insulating layer 36, and the first via 41 is produced.

Figure 7B:
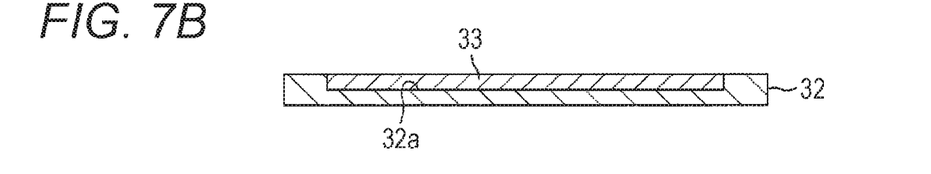

Meanwhile, as illustrated in FIG. 7B, the recessed portion 32a is formed at one surface (the upper surface) of the stretchable substrate 32. The stretchable wiring 33 is formed in the recessed portion 32a. A method similar to the method for forming the stretchable wiring 17 of the stretchable wiring board 11 according to the second embodiment can be used as the method for forming the stretchable wiring 33. In this manner, the stretchable substrate 32 configured such that the stretchable wiring 33 is formed on a portion of one surface is produced.

Figure 7C:
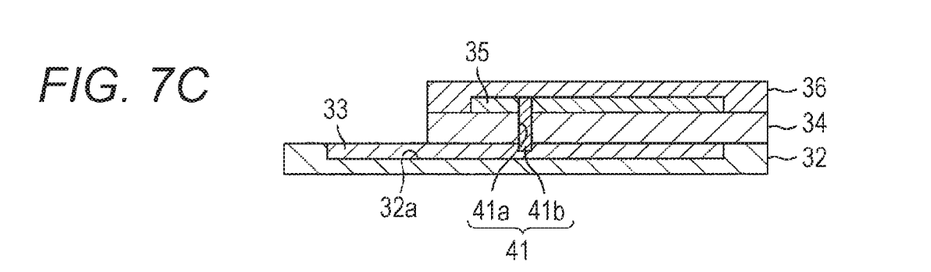

Next, as illustrated in FIG. 7C, the non-stretchable substrate 34 is bonded to the partial region of one surface (the upper surface) of the stretchable substrate 32, the partial region including at least a portion of the stretchable wiring 33. Thus, the non-stretchable substrate 34 having the conductor layer 35, the insulating layer 36, and the first via 41 is bonded to the stretchable substrate 32 provided with the stretchable wiring 33.

Figure 7D:
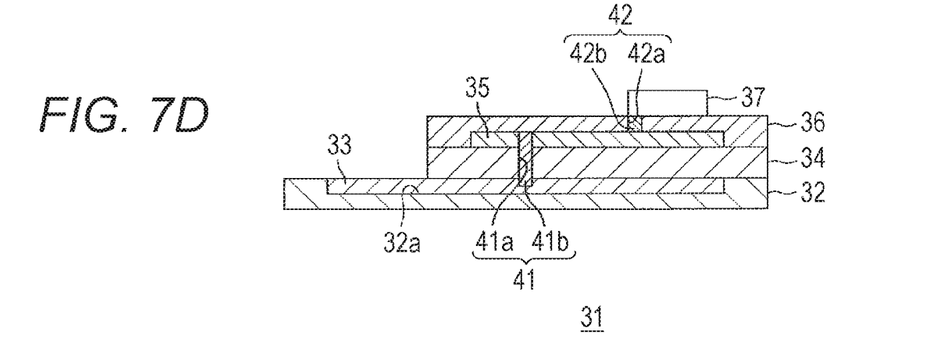

Next, as illustrated in FIG. 7D, the through-hole 42a is formed to penetrate the insulating layer 36 to the conductor layer 35. Subsequently, the conductive paste 42b is embedded in the through-hole 42a. Thus, the second via 42 is formed. Finally, the electronic component 37 is mounted on the insulating layer 36 with the electronic component 37 being electrically connected to the second via 42.

Figure 8:
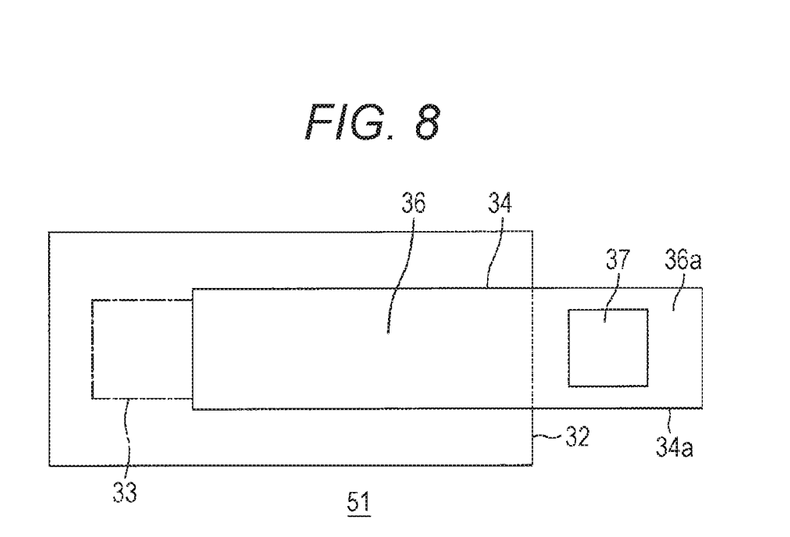
FIG. 8 is a schematic plan view of a stretchable circuit board of a fourth embodiment of the present invention.
Figure 9:
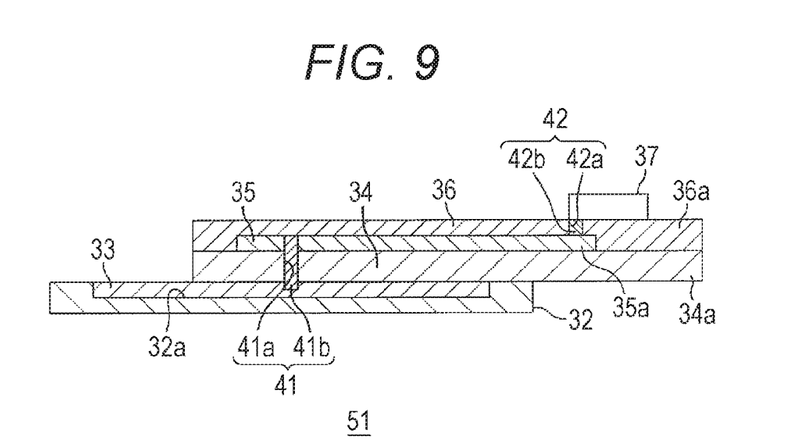
FIG. 9 is a schematic cross-sectional view of the stretchable circuit board of FIG. 8.

FIG. 8 is a schematic plan view of a stretchable circuit board of a fourth embodiment of the present invention. FIG. 9 is a schematic cross-sectional view of the stretchable circuit board of FIG. 8. In FIGS. 8 and 9, the same reference numerals as those of FIGS. 5 and 6 are used to represent elements corresponding to the elements of FIGS. 5 and 6.

A stretchable circuit board 51 includes a stretchable substrate 32. A recessed portion 32a is formed at one surface (an upper surface in FIG. 9) of the stretchable substrate 32. A stretchable wiring 33 is formed in the recessed portion 32a. A non-stretchable substrate 34 is bonded and fixed to a partial region of one surface (the upper surface) of the stretchable substrate 32, the partial region including at least a portion of the stretchable wiring 33. The non-stretchable substrate 34 has an extension 34a. The extension 34a extends outward from one end of the stretchable substrate 32.

A conductor layer 35 is formed on the surface (an upper surface in FIG. 9) of the non-stretchable substrate 34 opposite to the surface bonded to the stretchable substrate 32. The conductor layer 35 has an extension 35a formed on the extension 34a of the non-stretchable substrate 34. An insulating layer 36 covering the conductor layer 35 is formed on the upper surface of the non-stretchable substrate 34. The insulating layer 36 has an extension 36a covering the extension 35a of the conductor layer 35 and the extension 34a of the non-stretchable substrate 34. An electronic component 37 such as a semiconductor element is mounted on a surface (an upper surface in FIG. 9) of the extension 36a of the insulating layer 36.

The conductor layer 35 and the stretchable wiring 33 are electrically connected together through a first via 41 penetrating the non-stretchable substrate 34. The electronic component 37 and the extension 35a of the conductor layer 35 are electrically connected together through a second via 42 penetrating the extension 36a of the insulating layer 36.

The method for manufacturing the stretchable circuit board 51 of the fourth embodiment is similar to the method for manufacturing the stretchable circuit board 31 of the third embodiment as described above, and therefore, description thereof will not be repeated.

The embodiments of the present invention have been described above. Note that the present invention can be implemented in other forms. For example, in each of the stretchable circuit boards 11, 31, 51 of the above-described second to fourth embodiments, the electronic component 16, 37 is electrically connected to the conductor layer 14, 35 through the via 22, 42. The electronic component 16, 37 may be directly joined to the conductor layer 14, 35 by a joint member such as solder.

Use applications of the stretchable cable of the above-described first embodiment and the stretchable circuit boards of the above-described second to fourth embodiments include, for example, an electrocardiographic or myoelectric biosignal measurement sensor, a strain sensor, and a piezoelectric element electrode.

In addition, various design changes can be made within the scope of the matter described in the claims.

The present application corresponds to Japanese Patent Application No. 2015-55141 filed with Japan Patent Office on Mar. 18, 2015, the entire disclosure of which is incorporated herein by reference thereto.

DESCRIPTION OF REFERENCE SIGNS 1 stretchable cable
2 stretchable base material
3 stretchable wiring
11, 31, 51 stretchable circuit board
12, 32 stretchable substrate
13, 34 non-stretchable substrate
14, 35 conductor layer
15, 36 insulating layer
16, 37 electronic component
17, 33 stretchable wiring
21, 22, 41, 42 via

The invention claimed is:

1. A stretchable cable comprising:
a sheet-shaped base material exhibiting elasticity; and
a wiring formed on one surface of the base material and exhibiting elasticity, wherein
the wiring is made of a conductive composition containing elastomer and a conductive filler filling the elastomer, and
the conductive filler includes a dendrite-shaped conductive filler, a particle size of the dendrite-shaped conductive filler being in a range of equal to or greater than 1 µm and equal to or smaller than 20 µm, the dendrite-shaped conductive filler comprising at least one of copper, silver, silver-coated copper and gold-coated copper, wherein the conductive filler further includes a coil-shaped conductive filler, a conductor diameter of the coil-shaped conductive filler being in a range of equal to or greater than 5 um and equal to or smaller than 30 um, a coil outer diameter of the coil-shaped conductive filler being equal to or smaller than 150 um, a pitch of the coil-shaped conductive filler being in a range of equal to or greater than 10 um and equal to or smaller than 150 um, a coil length of the coil-shaped conductive filler being equal to or smaller than 1 mm.

2. A stretchable circuit board comprising:
a stretchable substrate exhibiting elasticity and comprising one surface and other surface opposite to the one surface;
a non-stretchable substrate bonded to a partial region of the one surface of the stretchable substrate, the non-stretchable substrate being one selected from a group consisting of a glass epoxy substrate, a bismaleimide substrate and a copper clad laminate; and
a stretchable wiring being in direct contact with the other surface of the stretchable substrate and exhibiting elasticity,
wherein the stretchable wiring is made of a conductive composition containing elastomer and a conductive filler filling the elastomer, and
the conductive filler includes a dendrite-shaped conductive filler, a particle size of the dendrite-shaped conductive filler being in a range of equal to or greater than 1 µm and equal to or smaller than 20 µm, the dendrite-shaped conductive filler comprising at least one of copper, silver, silver-coated copper and gold-coated copper.

3. The stretchable circuit board according to claim 2, further comprising:
a conductor layer formed on a surface of the non-stretchable substrate opposite to a surface bonded to the stretchable substrate; and
a first via penetrating the stretchable substrate and the non-stretchable substrate and connecting the stretchable wiring and the conductor layer together.

4. The stretchable circuit board according to claim 3, further comprising:
an insulating layer covering the conductor layer;
an electronic component provided on a surface of the insulating layer; and
a second via penetrating the insulating layer and electrically connecting the conductor layer and the electronic component together.

5. A stretchable circuit board comprising:
a stretchable substrate exhibiting elasticity;
a stretchable wiring being in direct contact with a portion of one surface of the stretchable substrate and exhibiting elasticity; and
a non-stretchable substrate bonded to a partial region of the one surface of the stretchable substrate and at least a portion of the stretchable wiring, the non-stretchable substrate being one selected from a group consisting of a glass epoxy substrate, a bismaleimide substrate and a copper clad laminate,
wherein the stretchable wiring is made of a conductive composition containing elastomer and a conductive filler filling the elastomer, and
the conductive filler includes a dendrite-shaped conductive filler, a particle size of the dendrite-shaped conductive filler being in a range of equal to or greater than 1 µm and equal to or smaller than 20 µm, the dendrite-shaped conductive filler comprising at least one of copper, silver, silver-coated copper and gold-coated copper.

6. The stretchable circuit board according to claim 5, further comprising:
a conductor layer formed on a surface of the non-stretchable substrate opposite to a surface bonded to the stretchable substrate; and
a first via penetrating the non-stretchable substrate and connecting the stretchable wiring and the conductor layer together.

7. The stretchable circuit board according to claim 6, further comprising:
an insulating layer covering the conductor layer;
an electronic component provided on a surface of the insulating layer; and a second via penetrating the insulating layer and electrically connecting the conductor layer and the electronic component together.

8. The stretchable circuit board according to claim 2, wherein the non-stretchable substrate is a rigid substrate or a flexible substrate.

9. The stretchable cable according to claim 1, wherein the coil-shaped conductive filler includes at least one of a metal spring and a helical structure of a plant or an alga coated with a metal plating.

10. The stretchable circuit board according to claim 5, wherein the non-stretchable substrate is directly bonded to the partial region of the one surface of the stretchable substrate and the at least the portion of the stretchable wiring.

11. The stretchable circuit board according to claim 5, wherein the one surface of the stretchable substrate comprises a recessed portion accommodating the stretchable wiring.

12. The stretchable circuit board according to claim 4, wherein the second via comprises a through-hole penetrating the insulating layer and a conductive paste embedded in the through-hole and electrically connecting the conductor layer and the electronic component together.

13. The stretchable circuit board according to claim 6, wherein the second via comprises a through-hole penetrating the insulating layer and a conductive paste embedded in the through-hole and electrically connecting the conductor layer and the electronic component together.

* * * * *